United States Patent

Brouillette et al.

[11] Patent Number: 5,897,336
[45] Date of Patent: Apr. 27, 1999

[54] DIRECT CHIP ATTACH FOR LOW ALPHA EMISSION INTERCONNECT SYSTEM

[75] Inventors: Guy Paul Brouillette; David Hirsch Danovitch, both of Quebec, Canada; Michael Liehr, Yorktown Heights, N.Y.; William Thomas Motsiff, Essex Junction, Vt.; Judith Marie Roldan, Ossining, N.Y.; Carlos Juan Sambucetti, Croton-on-Hudson, N.Y.; Ravi F. Saraf, Briarcliff Manor, N.Y.

[73] Assignee: International Business Machines Corporation, Armonk, N.Y.

[21] Appl. No.: 08/864,196

[22] Filed: May 28, 1997

Related U.S. Application Data

[62] Division of application No. 08/693,922, Aug. 5, 1996, abandoned.

[51] Int. Cl.[6] .................................................. H01L 21/44
[52] U.S. Cl. .......................................... 438/108; 438/613
[58] Field of Search ..................................... 438/108, 613, 438/614, 615

[56] References Cited

U.S. PATENT DOCUMENTS

| | | |
|---|---|---|
| 4,426,657 | 1/1984 | Abiru et al. . |
| 4,487,638 | 12/1984 | Hoge . |
| 4,931,852 | 6/1990 | Brown et al. . |
| 5,196,371 | 3/1993 | Kulesza et al. .......................... 438/614 |
| 5,468,995 | 11/1995 | Higgins, III . |
| 5,508,228 | 4/1996 | Nolan et al. ............................. 438/614 |
| 5,508,561 | 4/1996 | Tago et al. . |

*Primary Examiner*—Kevin M. Picardat
*Attorney, Agent, or Firm*—Tung & Associates

[57] ABSTRACT

An interconnect system that has low alpha particle emission characteristics for use in an electronic device includes a semiconductor chip that has an upper surface and spaced apart electrically resistive bumps positioned on conductive regions of the upper surface, the electrically resistive bumps are made of a composite material of a polymer and metal particles, and a substrate that has conductive regions bonded to the electrically resistive bumps in a bonding process wherein the electrically resistive bumps convert to electrically conductive bumps after the bonding process.

43 Claims, 2 Drawing Sheets

DIRECT CHIP ATTACH FOR LOW ALPHA EMISSION INTERCONNECT SYSTEM

This is a divisional of application Ser. No. 08/693,922 filed on Aug. 5, 1996, now abandoned.

FIELD OF THE INVENTION

The present invention is generally related to an electrical and mechanical connection between an integrated circuit device and a substrate and a method of making such connection, and more particularly, is related to an electrical and mechanical connection between an integrated circuit and a substrate by using an interconnect material that has low alpha particle emission and a method of making such connection.

BACKGROUND OF THE INVENTION

In the recent development of CMOS technology for designing low power consumption and high functionality chips, the problem of soft error generation has frequently been encountered. Soft error generation is the random generation of alpha particles from lead-containing interconnects which produces an electrical noise that is comparable to the low power signal in the chips. As a result, the integrated circuit chip has a significant soft error rate (SER). One obvious solution for the soft error generation problem is the use of lead-containing solder that has acceptably low alpha emission. However, this type of lead-containing solder is significantly more expensive and therefore presenting a limiting factor for the further development of present C4 (controlled collapse chip connection) technology. The C4 technology is a lead-rich lead/tin alloy used to interconnect chips directly to circuit boards which is widely used in the semiconductor industry.

The alpha-induced SER is driven by the presence of radioactive impurities in the C4 lead. In contrast to cosmic SER, alpha-induced SER is highly sensitive to $Q_{crit}$ (the amount of charge injected into a mode that will modify the state of a circuit). At approximately 20 fC of $Q_{crit}$, alpha SER begins to dominate over cosmic SER and increases with decreasing $Q_{crit}$ at a rate of 10×per 2~3 fC. The rate is reduced at $Q_{crit}$s of less than 16 f. The smallest CMOS 6's SRAM cells have nominal $Q_{crit}$ as low as 17 fC, resulting in SER's of 8 PPM/K-bit/Khr (or 1 fail/M-bit/12 yrs). Some CMOS 6's dynamic logic circuits in high-end products have been identified as having nominal $Q_{crit}$s of 20 fC. Therefore, C4 alpha-induced SER can no longer be ignored in the design of a CMOS logic circuitry. The alpha SER concern is accentuated due to the direct scaling or migration of these circuits into CMOS 7's which decreases $Q_{crit}$ by as much as 2×(10 fC $Q_{crit}$s will yield SER of approximately 100 ppm/k-ckt/khr=1 fail/M-ckt/yr). It is therefore necessary to consider the effect of SER along with the density/performance/power/reliability trade-offs that are usually encountered in modern chip design.

It is therefore an object of the present invention to provide an interconnect system that has low alpha particle emission characteristics that does not have the drawbacks or shortcomings of conventional lead-based interconnect systems.

It is another object of the present invention to provide in interconnect system that has low alpha particle emission characteristics for use in an electronic device that utilizes lead-free conductive bumps positioned on the surface of a semiconductor chip.

It is a further object of the present invention to provide an interconnect system that has low alpha particle emission characteristic for use in a semiconductor chip by utilizing conductive bumps that are formed of polymeric binder and metal particles.

It is still another object of the present invention to provide an interconnect system that has low alpha particle emission characteristics such that the soft error generation can be minimized.

It is another further object of the present invention to provide an interconnect system that has low alpha particle emission characteristics for use in a semiconductor device wherein conductive bumps formed of thermoplastic polymeric binder and metal flakes of a nobel metal are utilized.

It is yet another object of the present invention to provide an interconnect system that has low alpha particle emission characteristics for use in a semiconductor device including an IC chip that has conductive bumps built on the surface by composite material formed from a polymer and metal particles and a substrate that has conductive regions thereon bonded to the conductive bumps.

It is still another further object of the present invention to provide a method of making an interconnect system that has low alpha particle emission characteristics for use in an electronic device by bonding the conductive bumps formed of a polymer and metal particles to the conductive regions on a substrate.

SUMMARY OF THE INVENTION

The present invention provides an interconnect system that has low alpha particle emission characteristics for use in an electronic device which includes a semiconductor chip having an upper surface and spaced apart conductive bumps positioned on conductive regions of the upper surface, the conductive bumps are made of a composite material of a polymer and metal particles. The polymer is advantageously a thermoplastic polymer and the metal particles can be particles of gold, silver, palladium or platinum.

In a preferred embodiment, an interconnect system that has low alpha particle emission characteristics for use in a semiconductor device is provided which includes an integrated circuit chip that has an upper surface and spaced apart electrically resistive bumps positioned on the conductive regions of the upper surface, the electrically resistive bumps are formed of a composite material consists of a polymer and metal particles, and a substrate that has conductive regions which are bonded to the bumps on the chip. The electrically resistive bumps on the chip convert to electrically conductive bumps after the bonding process.

The present invention is further directed to a method of making electrical interconnections to an electronic device including the steps of first providing an electronic device that has a plurality of conductive regions positioned on the device, then depositing a plurality of electrically resistive bumps of a polymeric composite on the conductive regions, then providing a substrate that has a plurality of either bonding pads with conductive regions or resistive composite bumps on top of the bonding pad surface, and pressing the plurality of pads on the electronic device and the substrate together under a predetermined pressure and temperature for a length of time sufficient to establish electrical connections between the pads. The electrically resistive bumps convert to conductive bumps during the bonding process. The substrate can be made of a material of ceramic, epoxy, a semiconducting material or glass. The electrically resistive bumps can be made of a composite material of thermoplastic polymeric binder and metal particles of gold, silver, palladium or platinum. The predetermined pressure and temperature for bonding the composite bumps and the conductive regions on the substrate are between about 15 psi and about 1500 psi, and between about 150° C. and about 250° C., respectively. The length of time sufficient to establish electrical connection is between about 2 and about 300 seconds.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND THE ALTERNATE EMBODIMENTS

In accordance with the present invention, an interconnect system that has low alpha particle emission characteristics for use in an electronic device is provided which includes a semiconductor chip that has an upper surface and spaced apart electrically resistive bumps positioned on conductive regions of the upper surface where the electrically resistive bumps are formed by a composite material of a polymer and metal particles.

It has been found that alpha particle emission triggered by conventional lead-based interconnect systems causes soft-error in low power CMOS integrated circuits. The present invention offers a low-alpha emission interconnect system for attaching IC chips directly to substrates. The interconnect system is a polymer/metal particle composite where the conductive phase is composed of nobel metal particles such as silver, gold, palladium or platinum and the binder is a thermoplastic polymer. The composite material can be deposited in a paste form composed of polymer/metal particles/solvent system by using established dispensing processes to achieve a suitable interconnect dimension. The thermoplasticity of the matrix binder allows easy and inexpensive reworkability of the composite.

The present invention is also directed to a method of forming an electrical and mechanical connection between a chip and a substrate (i.e., a circuit board) by using an interconnect material which has low-alpha particle emission. The method forms an electrically conductive bond between the corresponding I/O pads on a chip and a substrate, and provides a lead-free to achieve the interconnection. In the present invention, a novel interconnect material and a bonding structure for attaching an IC chip to a substrate by a flip-chip method with acceptable low levels of alpha-particle generation are provided. The present invention also provides a lead-free interconnect material and technology to replace currently popular C4 interconnect system for reducing alpha-particle emission/generation.

Figure 1A:
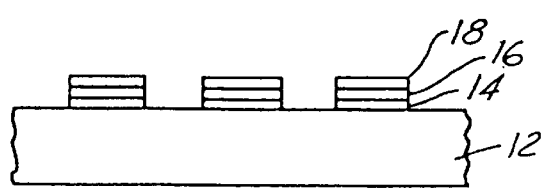
FIGS. 1A~1C show enlarged cross-sectional view of a chip (or a substrate) that has composite bumps deposited on bonding pads.
Figure 1B:
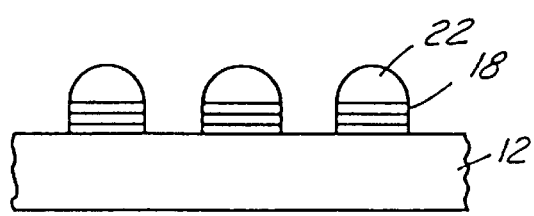
Figure 1C:
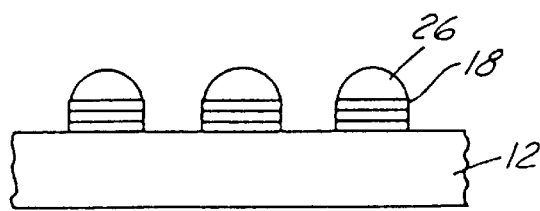

Referring initially to FIGS. 1A~1C where enlarged, cross-sectional views of a chip (or substrate) which has bonding pads and composite bumps built thereon are shown. In FIG. 1A, an integrated circuit chip 12 (or the substrate of a circuit board) which has I/O terminals for making electrical connections with a circuit board (or with a chip) is shown. The I/O terminals are sometimes referred to as bonding pads are not shown in FIG. 1A. A typical size of a bonding pad is between about 3 mils and about 12 mils. The center-to-center distance (or the pitch) is typically larger than 5 mils. The thicknesses of the bonding pads are frequently less than 10 $\mu$m. A metallurgical construction of the bonding pads which can be suitably used in the present invention at the pad/air interface are gold, palladium, palladium/nickel or nickel. The top layer of the metallurgical structure is sometimes referred to as the terminal metallurgy. The substrate, or the circuit board, can be made of ceramic or a suitable organic material such as a FR4. The substrate 10 (FIG. 2A) can be a single or a multi-chip module. The integrated circuit chip can be an individual chip or several chips mounted on a wafer which will both be referred to as a chip.

For a typical metallurgical structure of the chip pad, the layers stacked sequentially on the chip 12 can be an aluminum layer 14, a nickel layer 16 and a gold layer 18. The metallurgical structure can be constructed in the following manner. The top surface of the aluminum layer 14 is frequently modified by an exchange process of zincating to deposit nickel layer 16 on the aluminum. The gold layer 18 is then deposited on the nickel layer 16 a gold-immersion process. The process for depositing nickel and gold are self-selective methods which do not require expensive lithographic processes.

A typical metallurgical structure for a substrate 10 (FIG. 2A) (or a circuit board) can be a copper layer (in place of the aluminum layer for the chip), a nickel layer and a gold layer on top. A nickel layer can be electrolessly plated on the copper circuit board 1IO pads by using a standard palladium-seeding process. The gold layer 18 can be plated on a nickel layer 16 by a gold immersion process similar to that used on a chip. Similar to the chip metallurgical steps, the processes used for the substrate (or the circuit board) are also self-selective and do not require costly lithographic steps.

Figure 2A:
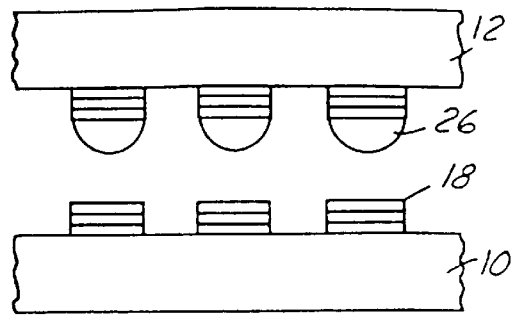
FIGS. 2A~2C show enlarged, cross-sectional view of three different embodiments for attaching a chip to a substrate.

After the metallurgical structure of aluminum/nickel/gold is built on an IC chip (or a copper/nickel/gold metallurgical structure is built on a substrate), a paste composed of a thermoplastic polymer binder, solvent and conductive solid particles can be dispensed on the I/O pads of a chip, or a substrate or both. In the preferred embodiment, the composite bumps are built on the IC chip only, which is shown in FIG. 2A. In the alternate embodiments shown in FIGS. 2B and 2C, the composite bumps are built on the substrate only and on both the chip and the substrate, respectively.

A composite bump 22 which is composed of a paste, sometimes referred to as a "wet bump", is shown in FIG. 1B. It is seen that wet bump 22 is deposited on integrated circuit chip (or a substrate) 12 on the bonding pads (not shown) with a terminal metallurgy 18 on the top surface of the pad. The terminal metallurgy 18 is gold for either an IC chip or a substrate.

The paste that constitutes the wet bump consists of a thermoplastic polymer binder, a solvent and conductive solid particles. The thermoplastic polymer binder can be either a single component made of a homopolymer or a segmented copolymer, or a blend of more than one homopolymer or copolymer. The length of the segments of the copolymer may be any number of repeating units larger than one. The repeating units consist of benzene rings with linkages made of siloxane, and/or moieties containing sulfur (such as sulfones) and/or moieties containing nitrogen (such as imides).

The solvent system used in the paste consists of one or more organic solvents selected from the group of solvent including ethers, esters, amides, lactones, ketones, sulfones, andaromatic hydrocarbons. Some typical examples include N-methyl-pyrrolidinone (NMP), diglyme, triglyme, xylene, amyl acetate, and acetophenone.

The conductive solid particles utilized in the paste can be nobel metal particles such as gold, silver, palladium, or composite particles that has inorganic or metallic core coated with a nobel metal. The inner core can be metal or semiconducting oxides such as silicon oxide, aluminum oxides, or metals such as copper, nickel or tin. The size of the metal particles are less than 5 $\mu$m to achieve fine pitch dispensability required for the interconnection. The shape of the particles can be flakes with some spheres. The relative amount of spherical particles can vary between about 1% and about 50%.

The resultant mixed paste contains about 10~20% solvent, 7~13% polymer binder and 69~78% conductive filler by weight. The resultant paste has zero shear viscosity in the range between about $10^3$ and about $10^5$ poise. At a shear rate ($\dot{r}$) in the range of between about 10 and about $10^3$/sec, the viscosity ($\eta$) should increase nonimally by following the equation:

$$\eta = K\dot{r}^{n-1}$$

The shear thinning index n should be less than 0.5 for the present invention system and preferably, less than 0.2.

The mixed paste can be dispensed by stencil screening through an appropriate mask to form features smaller than 150 $\mu$m at a pitch of larger than 200 $\mu$m without any smudges or shorting. For instance, an interconnect system having a 47 by 47 array of 75 $\mu$m bumps can be deposited at a pitch of 200 $\mu$m. The paste dot features can be screened through a 45 $\mu$m stencil. The stencil can be constructed of a metal such as molybdenum, stainless steel, nickel, etc. The stencil may also be constructed of an organic resist film such as that described in U.S. Pat. No. 5,314,709. Other conventional methods, such as silk screening, syringe dispensing, or extrusion screening may also be used in the present invention method. It has been discovered that the dispensing resolution is limited by the process desired. For instance, an increasing thickness of the stencil decreases the resolution of the screenability. For a dispensing process, the smallest feature size can be limited by the size of the syringe which typically sets the limit at 150 $\mu$m.

In the next step of fabricating the present invention composite bumps, the wet bump 22 shown in FIG. 1B is dried at a temperature between about 20° C. and about 120° C. either with or without vacuum to evaporate the solvent to form a "dry bump" 26, as shown in FIG. 1C. The dry bump 26 consists essentially of the thermoplastic polymer binder, the conductive metal particles and possibly trace amount of the solvent. A resultant dry bump on a chip or a substrate is shown in FIG. 1C after a typical drying time between about 1 and about 10 minutes. It has been discovered that at lower temperatures, e.g., at below 40° C., the drying process may be carried out for a longer period of time, i.e., as long as 2~3 days. Based on the thermoplastic nature of the polymer binder, the wet bump can be stored for a prolonged period of time in a dry environment before the drying process.

Figure 2B:
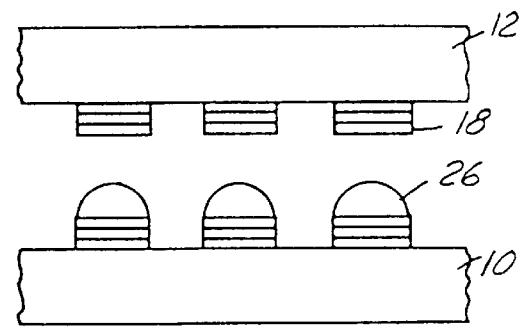
Figure 2C:
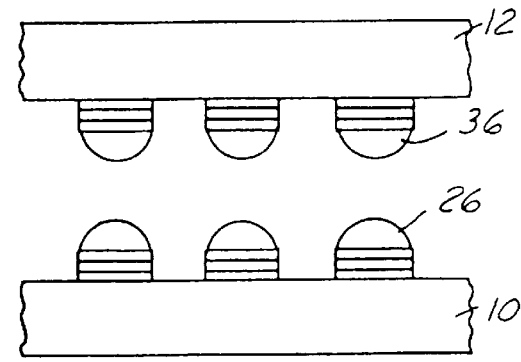

Referring now to FIGS. 2A~2C where three possible embodiments of the present invention bonding method are shown. In this processing step, the chip 12 and the substrate 10 are bonded together. Based on the thermoplastic nature of the polymer binder in the dry bump 22 (FIG. 1B), the time lapse between the initiation of the bonding step and the completion of the bumping step can be indefinite. However, it is desirable that the bumped electronic devices be stored in a dry environment.

FIGS. 2A~2C illustrates three different bonding configurations that are made possible by the present invention method. First, FIG. 2A shows an IC chip 12 which is dry bumped with bump 26 and a substrate 10 which is a bare pad having a terminal metallurgy 18 of gold. FIG. 2B illustrates a configuration where the substrate 10 is dry bumped with a bump 26 and the IC chip is a bare pad having a terminal metallurgy 18 of gold. FIG. 2C illustrates a configuration wherein both the IC chip 12 and the substrate 10 are dry bumped with bumps 26 and 36, respectively. In this configuration, the process for bumping the chip 12 and the substrate 10 are identical as illustrated in FIGS. 1A~1C. It should be noted that the conditions for dispensing, drying and paste formulation which are utilized may be different. For example, the stencil thickness, the drying time and the drying temperature used for building bumps 26 and 36 can be different.

Figure 3:
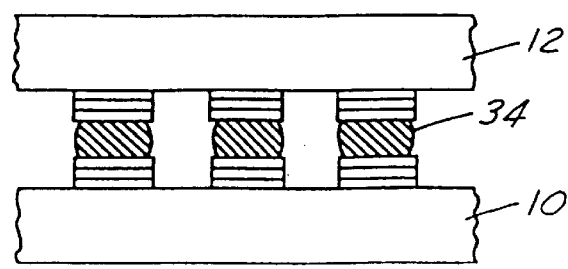
FIG. 3 is an enlarged, cross-sectional view of a chip bonded to a substrate structure.

The bonding process between the dry bumps can be accomplished by first aligning the dry bumps 26 to the bonding pads that has terminal metallurgy 18 (see FIGS. 2A or 2B) in the first two configurations, respectively; or by aligning the dry bumps 26 and 36 as in the third configuration. The dry bump bonding pad or the dry bump/dry bump are then held under pressure at a bonding temperature above the softening temperature of the polymeric binder. Typically, the bonding temperature is in a range about 150° C. and about 250° C. at a bonding pressure of between about 15 psi and about 1500 psi. During the bonding process, it is preferred that the final bonding pressure is achieved before the final bonding temperature is reached. It has been discovered that a suitable bonding time after the final pressure and temperature are reached is between about 2 and about 120 seconds. FIG. 3 illustrates a structure of chip 12 and substrate 10 bonded together by interconnect 34.

Figure 4:
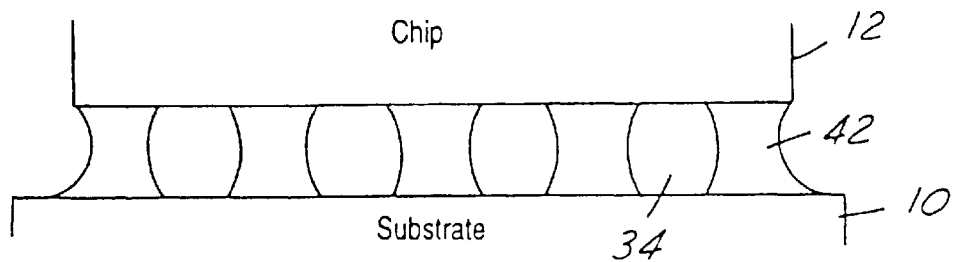
FIG. 4 is an enlarged, cross-sectional view of a chip bonded to a substrate structure after an encapsulation process.

The bonded structure of the IC chip and the substrate may optionally be filled with an encapsulant 42. This is shown in FIG. 4. The encapsulant 42 can be typically an epoxy resin containing low alpha particle fillers for providing mechanical strength to the structure and improved thermal conduction of the heat generated during the electrical operation of the chip/substrate assembly.

It should be noted that the encapsulation process for the bonded structure is optional and may not be required if the bonding pads are large and are reasonably spaced apart, or the chip application is under a dry or hermetic environment. The method used for encapsulation can be any of the conventional methods which utilizes capillary flow of the materials in the small gaps between the chip and the substrate. The encapsulant that are typically used in the industry underfilling may be utilized in the present invention applications. For instance, in a typical encapsulation application, the encapsulant is flown into the gap by capillary action at approximately 80° C. when the pads are 150 $\mu$m spaced apart at a 200 $\mu$m pitch. In one example, only the chip side is dry bumped and the bonding is performed at about 220° C. under a load of 1000 psi for 3 minutes. The nominal gap between the chip and the substrate is about 40 $\mu$m. It has been demonstrated that the bump height for the C4 size feature is adequate to create enough clearance for the encapsulant to penetrate into the gap. It should also be noted that encapsulation enhances the adhesion strength of the interconnect system such that an effective adhesion of larger than 30 MPa can be achieved.

It has been discovered that the actual compositions of the paste material can be broader than those previously illustrated as long as the structures shown in FIGS. 3 and 4 satisfy several of the important properties. First, the interconnect material should have a high bulk conductivity that is comparable to that of lead/tin solder. Secondly, the contact resistance to the terminal metallurgy on top of the bonding pads should be comprarable to that of solder, i.e., smaller than 1 $\mu\Omega$-cm$^2$ for either a chip or a substrate application. Thirdly, in order to achieve a mechanically, chemically and thermally reliable structure, the clearance between the chip and the substrate should be underfilled with a low alpha particle emission encapsuiment, e.g., of the ceramic/epoxy type. Fourthly, it should be possible to dispense on an array of 100 $\mu$m pad at a pitch of 200 $\mu$m in applications for CMOS chips. Lastly, the height of the interconnect should be adequate such that an encapsulment can be used to underfill with a thermal conductivity of larger than 0.7 W/m/K.

EXAMPLE

Figure 5:
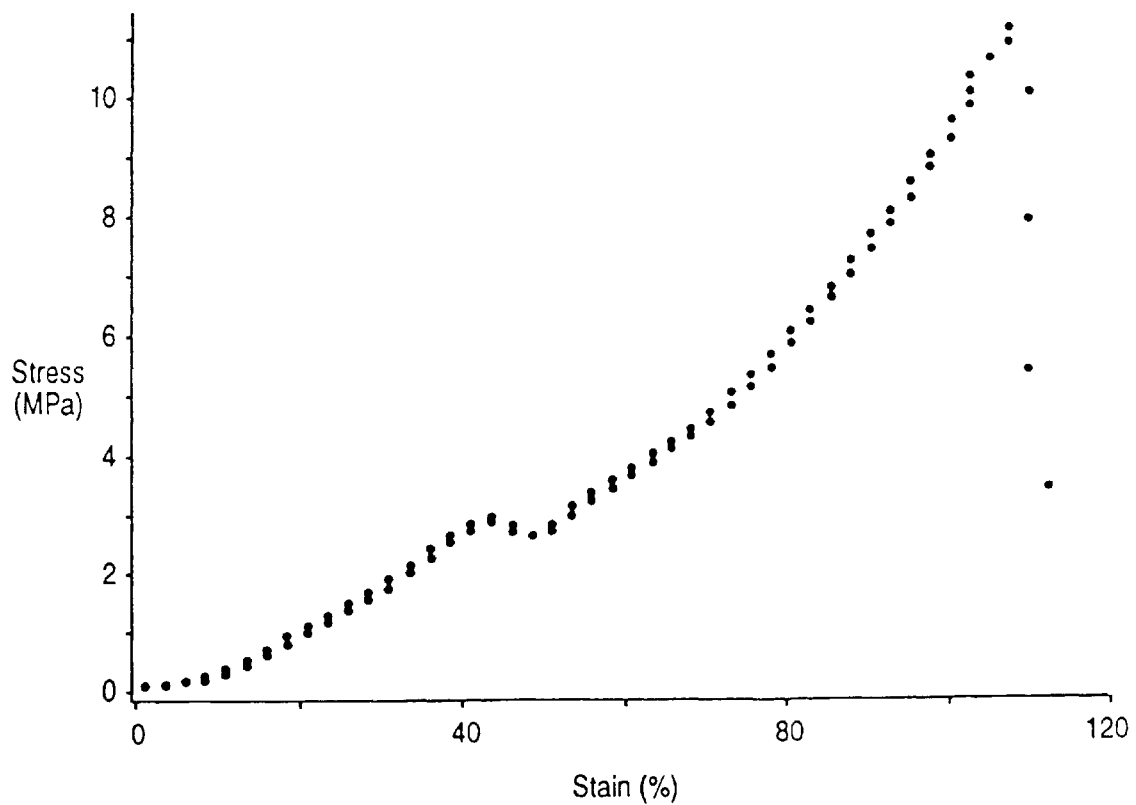
FIG. 5 is a graph showing tensile stress/strain realtionship for a chip/substrate bonded together by 121 interconnects.

In this particular example, a paste is constructed which is composed of 30% by weight of polyimide siloxane in a solvent of acetophenone, and 88% by weight (relative to the polymer) silver particles. The average size of the silver flakes is about 5 $\mu$m. An 11×11 array of 150 $\mu$m features is screened at 200 $\mu$m pitch by a molybdenum stencil having a thickness of 225 $\mu$m. A final bump height was obtained at about 65 $\mu$m. The bulk resistivity of the interconnect obtained is about 22 $\mu\Omega$-cm, while the resulting contact resistance to gold metallurgy is measured at between 0.6~0.7 $\mu\Omega$cm$^2$. FIG. 5 shows a graph illustrating the stress-strain behavior of the interconnect system as a chip is pulled away from a substrate under a tensile force. The speed of separation was 2.5 mm/sec. The adhesion strength measured is about 11.5 MPa for the interconnect structure without encapsulation. The adhesive strength achieved is typical and can be significantly improved by an encapsulation process to larger than 30 MPa.

While the present invention has been described in an illustrative manner, it should be understood that the terminology used is intended to be in a nature of words of description rather than of limitation.

Furthermore, while the present invention has been described in terms of a preferred embodiment and two alternate embodiments, it is to be appreciated that those skilled in the art will readily apply these teachings to other possible variations of the invention.

The embodiments of the invention in which an exclusive property or privilege is claimed are defined as follows:

1. A method of making electrical interconnections to an electronic device comprising the steps of:
   providing an electronic device having a plurality of conductive regions positioned on the device,
   depositing a plurality of electrically resistive bumps of a polymeric based composite on said conductive regions,
   providing a substrate having a plurality of conductive regions on a top surface, and
   pressing said plurality of electrically resistive bumps against said conductive regions on said substrate under a pressure and temperature for a length of time sufficient to establish an electrical connection and an adhesive bond between electrically conductive bumps which are converted from said electrically resistive bumps and the conductive regions on said substrate.

2. The method according to claim 1, wherein said conductive regions of said electronic device are bonding pads.

3. The method according to claim 1, wherein said electronic device is an integrated circuit chip.

4. The method according to claim 1, wherein the resistivity of said conductive bumps after said bonding step is less than 1000 $\mu\Omega$-cm.

5. The method according to claim 1, wherein a bond formed between the electronic device and the substrate is greater than 5 MPa.

6. The method according to claim 1, wherein said substrate is made of a material selected from the group consisting of ceramic, epoxy, a semiconducting material and glass.

7. The method according to claim 1, wherein said electrically conductive regions on said substrate comprise electrically resistive bumps made up of a polymeric composite.

8. The method according to claim 1, wherein said electrically conductive regions on said substrate comprises bumps made of a thermoplastic polymer and metal particles.

9. The method according to claim 1 further comprising the step of encapsulating said conductive bumps by injecting encapsulant between said electronic device and said substrate.

10. The method according to claim 1, wherein said predetermined pressure and temperature are between about 15 psi and about 1,500 psi, and between about 150° C. and about 250° C., respectively.

11. The method according to claim 1, wherein said length of time sufficient to establish electrical connections is between about 2 and about 120 seconds.

12. The method according to claim 1, wherein said electrically resistive bumps are converted to electrically conductive bumps after said pressing step.

13. A method for making electrical interconnections to an electronic device comprising the steps of:
   providing an electronic device having a plurality of conductive regions positioned on the device,
   depositing a plurality of electrically resistive bumps of a polymeric based composite on said conductive regions, said plurality of electrically resistive bumps having a resistivity more than 1000 $\mu\Omega$-cm,
   providing a substrate having a plurality of conductive regions on a top surface, and
   pressing said plurality of electrically resistive bumps against said conductive regions on said substrate under a pressure and temperature for a length of time sufficient to establish an electrical connection and an adhesive bond between electrically conductive bumps having a resistivity of less than 1000 $\mu\Omega$-cm which are converted from said electrically resistive bumps and the conductive regions on said substrate.

14. The method according to claim 13, wherein an adhesive bond formed between the electronic device and the substrate is greater than 5 MPa.

15. The method according to claim 13, wherein said substrate is made of a material selected from the group consisting of ceramic, epoxy, a semiconducting material and glass.

16. The method according to claim 13, wherein said electrically conductive regions on said substrate comprise electrically resistive bumps made up of a polymeric composite.

17. The method according to claim 13, wherein said electrically conductive regions on said substrate comprises bumps made of a thermoplastic polymer and metal particles.

18. The method according to claim 13 further comprising the step of encapsulating said conductive bumps by injecting encapsulant between said electronic device and said substrate.

19. The method according to claim 13, wherein said pressure and temperature are between about 15 psi and about 1,500 psi, and between about 150° C. and about 250° C., respectively.

20. The method according to claim 13, wherein said length of time sufficient to establish electrical connections is between about 2 and about 120 seconds.

21. A method of making electrical interconnections to an electronic device comprising the steps of:

provinding an electronic device having a plurality of conductive regions positioned on the device, depositing a plurality of electrically resistive bumps of a polymeric based composite on said conductive regions, providing a substrate having a plurality of conductive regions on a top surface, and pressing said plurality of electrically resistive bumps against said conductive regions on said substrate under a pressure of between about 15 psi and about 1500 psi and a temperature between about 150° C. and about 250° C. for a length of time sufficient to establish an electrical connection and an adhesive bond between electrically conductive bumps which are converted from said electrically resistive bumps and the conductive regions on said substrate.

22. The method according to claim 21, wherein said conductive regions of said electronic device are bonding pads.

23. The method according to claim 21, wherein said electronic device is an integrated circuit chip.

24. The method according to claim 21, wherein the resistivity of said conductive bumps after said bonding step is less than 1000 µΩ-c.

25. The method according to claim 21, wherein an adhesive bond formed between the electronic device and the substrate is greater than 5 MPa.

26. The method according to claim 21, wherein said substrate is made of a material selected from the group consisting of ceramic, epoxy, a semiconducting material and glass.

27. The method according to claim 21 wherein said electrically conductive regions on said substrate comprise electrically resistive bumps made up of a polymeric composite.

28. The method according to claim 21, wherein said electrically conductive regions on said substrate comprises bumps made of a thermoplastic polymer and metal particles.

29. The method according to claim 21 further comprising the step of encapsulating said conductive bumps by injecting encapsulant between said electronic device and said substrate.

30. The method according to claim 21, wherein said length of time sufficient to establish electrical connections is between about 2 and about 120 seconds.

31. The method according to claim 21, wherein said electrically resistive bumps are converted to electrically conductive bumps after said pressing step.

32. A method of making electrical interconnections to an electronic device comprising the steps of:

providing an electronic device having a plurality of conductive regions positioned on the device, depositing a plurality of electrically resistive bumps of a polymeric based composite containing at least 10 weight percent solvent on said conductive regions, drying said plurality of electrically resistive bumps at a temperature between about 20° C. and about 120° C. for evaporating solvent contained in said bumps, providing a substrate having a plurality of conductive regions on a top surface, and pressing said plurality of electrically resistive bumps against said conductive regions on said substrate under a pressure and temperature for a length of time sufficient to establish an electrical connection and an adhesive bond between electrically conductive bumps which are converted from said electrically resistive bumps and the conductive regions on said substrate.

33. The method according to claim 32, wherein said substrate is made of a material selected from the group consisting of ceramic, epoxy, a semiconducting material and glass.

34. The method according to claim 32, wherein said electrically conductive regions on said substrate comprise electrically resistive bumps made up of a polymeric composite.

35. The method according to claim 32, wherein said electrically conductive regions on said substrate comprises bumps made of a thermoplastic polymer and metal particles.

36. The method according to claim 32 further comprising the step of encapsulating said conductive bumps by injecting encapsulant between said electronic device and said substrate.

37. The method according to claim 32, wherein said predetermined pressure and temperature are between about 15 psi and about 1,500 psi, and between about 150° C. and about 250° C., respectively.

38. The method according to claim 32, wherein said length of time sufficient to establish electrical connections is between about 2 and about 120 seconds.

39. The method according to claim 32, wherein said electrically resistive bumps are converted to electrically conductive bumps after said pressing step.

40. The method according to claim 32, wherein said conductive regions of said electronic device are bonding pads.

41. The method according to claim 32, wherein said electronic device is an integrated circuit chip.

42. The method according to claim 32, wherein the resistivity of said conductive bumps after said bonding step is less than 1000 µΩ-cm.

43. The method according to claim 32, wherein a bond formed between the electronic device and the substrate is greater than 5 MPa.

* * * * *